(12) United States Patent
Ohta et al.

(10) Patent No.: US 7,589,391 B2
(45) Date of Patent: Sep. 15, 2009

(54) SEMICONDUCTOR DEVICE WITH STI AND ITS MANUFACTURE

(75) Inventors: Hiroyuki Ohta, Kawasaki (JP); Yasunori Iriyama, Kawasaki (JP)

(73) Assignee: Fujitsu Microelectronics Limited, Tokyo (JP)

(*) Notice: Subject to any disclaimer, the term of this patent is extended or adjusted under 35 U.S.C. 154(b) by 188 days.

(21) Appl. No.: 11/433,671

(22) Filed: May 15, 2006

(65) Prior Publication Data

US 2006/0202301 A1 Sep. 14, 2006

Related U.S. Application Data

(62) Division of application No. 10/283,128, filed on Oct. 30, 2002, now abandoned.

(30) Foreign Application Priority Data

Mar. 18, 2002 (JP) ............................. 2002-074871

(51) Int. Cl.
*H01L 21/762* (2006.01)
(52) U.S. Cl. .................... 257/510; 257/21.545
(58) Field of Classification Search ......... 257/506–510, 257/369, E21.545
See application file for complete search history.

(56) References Cited

U.S. PATENT DOCUMENTS

| | | | |
|---|---|---|---|
| 4,635,090 A * | 1/1987 | Tamaki et al. ............... | 257/513 |
| 4,666,556 A | 5/1987 | Fulton et al. | |
| 5,059,550 A * | 10/1991 | Tateoka et al. .............. | 438/432 |
| 5,447,884 A | 9/1995 | Fahey et al. | |
| 6,103,635 A * | 8/2000 | Chau et al. .................. | 438/739 |
| 6,159,823 A * | 12/2000 | Song et al. .................. | 438/437 |
| 6,251,746 B1 | 6/2001 | Hong et al. | |
| 6,258,692 B1 | 7/2001 | Chu et al. | |
| 6,465,866 B2 | 10/2002 | Park et al. | |
| 6,642,125 B2 | 11/2003 | Oh et al. | |
| 6,720,234 B2 | 4/2004 | Suzuki et al. | |
| 2002/0003275 A1 | 1/2002 | Lee et al. | |
| 2002/0070421 A1 | 6/2002 | Ashburn et al. | |

(Continued)

FOREIGN PATENT DOCUMENTS

JP 58-9333 A 1/1983

(Continued)

OTHER PUBLICATIONS

Japanese Office Action dated Sep. 5, 2008, issued in corresponding Japanese Application No. 2002-074871.

*Primary Examiner*—Nathan W Ha
(74) *Attorney, Agent, or Firm*—Westerman, Hattori, Daniels & Adrian, LLP.

(57) ABSTRACT

A semiconductor device includes: a silicon substrate with semiconductor elements; an isolation trench formed in the silicon substrate for isolating active regions in the silicon substrate, the isolation trench having a trapezoidal cross sectional shape having a width gradually narrowing with a depth from the surface of the silicon substrate; a first liner insulating film formed on the surface of the trench and made of a silicon oxide film or a silicon oxynitride film having a thickness of 1 to 5 nm; a second liner insulating film formed on the first liner insulating film and made of a silicon nitride film having a thickness of 2 to 8 nm; and an isolation region burying the trench defined by the second liner insulating film.

8 Claims, 14 Drawing Sheets

U.S. PATENT DOCUMENTS

2004/0080018 A1  4/2004  Kim et al.
2004/0227208 A1  11/2004  Lee et al.

FOREIGN PATENT DOCUMENTS

| JP | 8-46029 A | 2/1996 |
|---|---|---|
| JP | 11-297811 | 10/1999 |
| JP | 11-340461 | 12/1999 |
| JP | 2000-31261 | 1/2000 |
| JP | 2000-31267 | 1/2000 |
| JP | 2000-124303 A | 4/2000 |
| JP | 2000-323565 A | 11/2000 |
| JP | 2001-135718 | 5/2001 |
| JP | 2001-160589 | 6/2001 |

* cited by examiner

SEMICONDUCTOR DEVICE WITH STI AND ITS MANUFACTURE

CROSS REFERENCE TO RELATED APPLICATIONS

This application is a Divisional application of application Ser. No. 10/283,128, filed on Oct. 30, 2002 now abandoned, which is based on Japanese Patent Application No. 2002-074871, filed on Mar. 18, 2002, the entire contents of which are incorporated herein by reference.

BACKGROUND OF THE INVENTION

A) Field of the Invention

The present invention relates to a semiconductor device and its manufacture method, and more particularly to a semiconductor device having shallow trench isolation (STI) and its manufacture method.

B) Description of the Related Art

Local oxidation of silicon (LOCOS) is known as one method for the element isolation of a semiconductor device.

According to LOCOS technique, a silicon oxide film is formed on a silicon substrate as a buffer layer, thereafter a silicon nitride film as an oxidation prevention film is formed, the silicon nitride film is patterned and then the surface of the silicon substrate is thermally oxidized.

While the silicon substrate is thermally oxidized, oxidizing species such as oxygen and moisture invade the buffer silicon oxide film. As a result, the silicon substrate surface under the silicon nitride film is oxidized and silicon oxide regions having a shape called a bird's beak are formed. These bird's beak regions cannot be used substantially as an element forming region (active region) so that the area of the active region is reduced.

If the surface of a silicon substrate is thermally oxidized by using a silicon nitride film pattern having openings of various sizes, the thickness of a silicon oxide film formed on the silicon substrate surface in an area corresponding to an opening of a smaller size is thinner than that of a silicon oxide film formed in an area corresponding to an opening of a lager size. This phenomenon is called thinning.

The area not used as the active region in the whole area of a semiconductor substrate increases because of bird's beaks and thinning which occur more often as semiconductor devices are made finer. Namely, since a ratio of the active region to the whole substrate area is substantially lowered, high integration of semiconductor devices is hindered.

Trench isolation (TI) technique is know as the technique of forming active regions by which a trench is formed in the surface layer of a semiconductor substrate and insulating material or polysilicon is filled in the trench. This method has been used bipolar transistor LSIs which require a deep isolation region.

Application of trench isolation technique to MOS transistor LSIs is prevailing because of no bird's beak and thinning. Isolation for a MOS transistor LSI does not require as deep isolation as that of a bipolar transistor LSI and can be realized by a relatively shallow trench of about 0.1 to 1.0 µm. This is called a shallow trench isolation (STI) structure.

With reference to FIGS. 9A to 9H, an STI process will be described.

As shown in FIG. 9A, on the surface of a silicon substrate 1, a silicon oxide film 2 having a thickness of, e.g., 10 nm is formed by thermal oxidation. On this silicon oxide film 2, a silicon nitride film 3 having a thickness of e.g., 100 to 150 nm is formed by chemical vapor deposition (CVD). The silicon oxide layer 2 functions as a buffer layer for relaxing a stress between the silicon substrate 1 and silicon nitride film 3. The silicon nitride film 3 is functions also as a stopper layer during a later polishing process.

A resist pattern 4 is formed on the silicon nitride film 3. An opening defined by the resist pattern 4 defines an area in which the active region is formed. The region of the silicon substrate under the resist pattern becomes an active region where device elements are formed.

By using the resist pattern 4 as an etching mask, the silicon nitride film 3 exposed in the opening and the underlying silicon oxide film 2 and silicon substrate 1 are etched to a depth of, e.g., about 0.5 µm by reactive ion etching (RIE) to form a trench 6. Thereafter, the resist pattern 4 is removed.

As shown in FIG. 9B, the silicon substrate surface exposed in the trench 6 is thermally oxidized to form a silicon oxide film 7 having a thickness of, e.g., 10 nm.

As shown in FIG. 9C, burying the trench, a silicon oxide layer 9 is deposited over the silicon substrate, for example, by high density plasma (HDP) CVD. In order to make dense the silicon oxide film 9 as the isolation region, the silicon substrate is annealed, for example, in a nitrogen atmosphere at 900 to 1100° C.

As shown in FIG. 9D, by using the silicon nitride film 3 as a stopper, the silicon oxide layer 9 is etched downward by chemical mechanical polishing (CMP) or reactive ion etching (RIE). The silicon oxide film 9 is left only in the trench defined by the silicon nitride film 3. At this stage, annealing may be performed for making silicon oxide dense.

As shown in FIG. 9E, the silicon nitride film 3 is removed by using hot phosphoric acid. Next, the buffer silicon oxide film 2 on the surface of the silicon substrate 1 is removed by using dilute hydrofluoric acid. At this time, the silicon oxide film 9 buried in the trench is also etched.

As shown in FIG. 9F, the surface of the silicon substrate 1 is thermally oxidized to form a sacrificial silicon oxide film 22 on the silicon substrate 1 surface. Impurity ions of a predetermined conductivity type are implanted into the surface layer of the silicon substrate 1 via the sacrificial silicon oxide film, and activated to form wells 10 of the predetermined conductivity type in the silicon substrate 1.

The sacrificial silicon oxide film 22 is thereafter removed by using dilute hydrofluoric acid. While the sacrificial silicon oxide film is removed, the silicon oxide layer 9 is also etched by the dilute hydrofluoric acid. By a plurality of hydrofluoric acid processes, the silicon oxide layer 9 buried in the trench is etched so that a dug divot or indent is formed along the side of the active region.

As shown in FIG. 9G, the surface of the exposed silicon substrate is thermally oxidized to form a silicon oxide film 11 having a desired thickness which film is used as the gate insulating film. A polysilicon layer 12 is deposited over the silicon substrate 1, and patterned to form a gate electrode. Impurity ions of the conductivity type opposite to that of the wells 10 are implanted and activated to form source/drain regions. If necessary, side wall spacers are formed on the side walls of the gate electrode, and impurity ions are again implanted and activated to form high impurity concentration source/drain regions.

FIG. 9H shows the characteristics of drain current relative to gate voltage of a transistor manufactured as above. The abscissa represents gate voltage and the ordinate represents drain current. A curve r shows the characteristic of a normal transistor. A curve h shows the characteristics of a transistor formed by the above-described processes. As seen from the curve h, the drain current starts flowing at a lower gate voltage. This analysis results in that a parasitic transistor turning on at a low threshold voltage is added.

If the shoulder S of the isolation region 9 is etched and divots or recesses are formed as shown in FIG. 9G, the shoulder of the active region of the silicon substrate is surrounded by the gate electrode not only from the upper surface of the active region but also from the side thereof. As voltage is applied to the gate electrode having such a shape, the shoulder of the active region undergoes an electric field concentration so that a transistor having a lower threshold voltage is formed. This parasitic transistor forms the hump characteristics indicated by the curve h shown in FIG. 9H.

As seen from the curve h, the drain current at a higher gate voltage is lower than that of the curve r. As heat treatment is performed in order to make dense the silicon oxide buried in the trench, the silicon oxide layer 9 contracts so that the active region surrounded by the silicon oxide film 9 receives a compression stress.

As the compression stress is applied, the mobility of electron/hole in the active region of the silicon substrate 1 may lower, which reduces the saturated drain current. As the element is made finer and the area of the active region is made small, the influence of the compression stress increases.

In IEDM 1988, pp. 92-95, B. Davari et al. have proposed to implant ions into the shoulder of an active region in order to suppress the hump characteristics.

Another method has been proposed to round the shoulder of an active region through thermal oxidation in order to suppress the hump characteristics. Since the shoulder is rounded and the electric field concentration is relaxed, the influence of a parasitic transistor can be mitigated.

In IEDM 1992, pp. 57-60, Pierre C. Fazan et al. have proposed to form insulating side wall spacers on the side walls of an isolation silicon oxide film protruding from an upper surface of a silicon substrate to thereby bury divots.

Although STI is suitable for the microfine structure of semiconductor devices, there occur problems specific to STI. New techniques capable of solving the problems specific to STI have been desired to date.

SUMMARY OF THE INVENTION

It is an object of this invention to provide a semiconductor device with STI capable of presenting good transistor characteristics.

It is another object of the invention to provide a method of manufacturing a semiconductor device having good transistor characteristics.

According to one aspect of the present invention, there is provided a semiconductor device comprising: a silicon substrate with semiconductor elements; an isolation trench formed in the silicon substrate for separating active regions in the silicon substrate, the isolation trench having a trapezoidal cross sectional shape having a width gradually narrowing with a depth from a surface of the silicon substrate; a first liner insulating film formed on a surface of the trench and made of a silicon oxide film or a silicon oxynitride film having a thickness of 1 to 5 nm; a second liner insulating film formed on the first liner insulating film and made of a silicon nitride film having a thickness of 2 to 8 nm; and an isolation region burying the trench defined by the second liner insulating film.

According to another aspect of the present invention, there is provided a method of manufacturing a semiconductor device, comprising steps of: (a) forming a polishing stopper layer on a surface of a silicon substrate, the stopper layer including a silicon oxide film and a silicon nitride film; (b) etching the stopper layer and the silicon substrate by using a mask to form a trench; (c) forming a first liner insulating film on a surface of the silicon substrate exposed in the trench, the first liner insulating film being a silicon oxide film or a silicon oxynitride film having a thickness of 1 to 5 nm; (d) forming a second liner insulating film on the first liner insulating film, the second liner insulating film being made of a silicon nitride film having a thickness of 2 to 8 nm; (e) depositing an isolation layer on the silicon substrate, the isolation layer burying the trench defined by the second liner insulating film; (f) polishing and removing an unnecessary portion of the isolation layer by using the stopper layer as a polishing stopper; and (g) etching the stopper layer.

As above, it is possible to provide a transistor device with STI and relaxed electric field concentration on the shoulders of an active region, and its manufacture method.

Since a silicon nitride film is left at least on the side walls of a trench, a tensile stress is applied to the channel region of the active region so that a reduction in the mobility can be relaxed.

The formation of a hump and the reverse narrow channel effects can be suppressed.

DESCRIPTION OF THE PREFERRED EMBODIMENTS

Embodiments of the invention will be described with reference to the accompanying drawings.

FIGS. 1A to 1H are schematic cross sectional views illustrating main processes of a method of manufacturing a semiconductor device according to an embodiment of the invention.

Figure 1A:
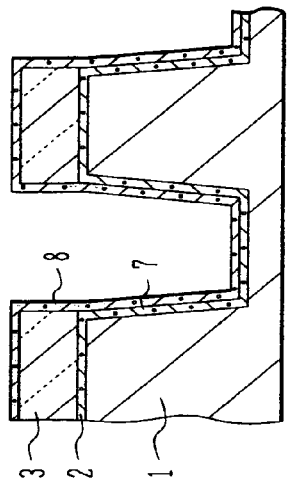
FIGS. 1A to 1H are cross sectional views illustrating a method of manufacturing a semiconductor device according to an embodiment of the invention.

As shown in FIG. 1A, the surface of a silicon substrate 1 is thermally oxidized to form a silicon oxide film 2 having a thickness of 9 to 21 nm, e.g., 10 nm. On the silicon oxide film 2, a silicon nitride film 3 having a thickness of 100 to 150 nm is formed by low pressure (LP) chemical vapor deposition (CVD). For example, LPCVD is performed at a temperature of 700° C. by using $SiCl_2H_2$ and $NH_3$ as source gas.

A resist film is coated on the silicon nitride film 3, exposed and developed to form a resist pattern 4. The resist pattern 4 has an opening or openings for defining an isolation region or regions and active regions (element regions) each surrounded by the isolation region. The width of an opening 5a is, for example, 0.2 to 1 μm.

By using the resist pattern 4 as an etching mask, the silicon nitride film 3, silicon oxide film 2 and silicon substrate 1 are etched. The silicon substrate 1 is etched by a depth of 0.5 μm to form a trench 6. For example, the silicon nitride film and silicon oxide film are etched by using mixture gas of $CF_4+CHF_3+Ar$ as etchant, and the silicon substrate 1 is etched by using mixture gas of $HBr+O_2$ or $Cl_2+O_2$ as etchant.

With these etching conditions, the side walls of the trench 6 have slanted surfaces. With these slanted surfaces, electric field concentration upon the shoulder of the active region can be relaxed. The resist pattern 4 is thereafter removed.

Figure 1C:
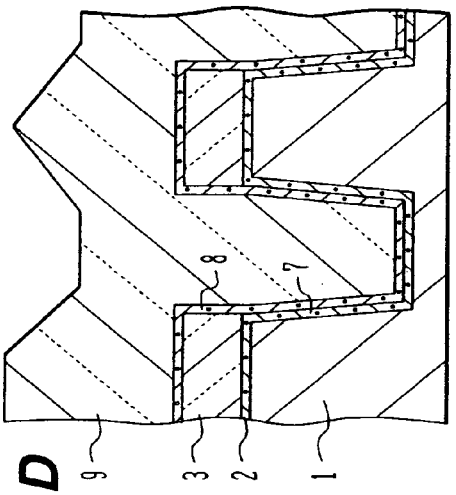
Figure 1B:
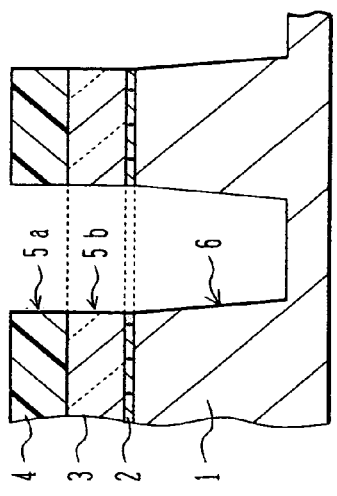

As shown in FIG. 1B, the silicon substrate surface exposed in the trench 6 is thermally oxidized to form a silicon oxide film 7 having a thickness of 1 to 5 nm. The whole silicon surface exposed in the trench 6 is covered with the silicon oxide film 7.

As shown in FIG. 1C, a silicon nitride film 8 is formed by LPCVD, covering the surfaces of the silicon oxide film 7 and silicon nitride film 3. The thickness of the silicon nitride film 8 is 2 to 8 nm. This thickness of 2 to 8 nm of the silicon nitride film 8 makes it difficult for hot phosphoric acid to be used for etching silicon nitride to penetrate into this thin film 8.

LPCVD is performed at a temperature of about 650° C. by using mixture gas of $SiCl_2H_2+NH_3$ as source gas. The silicon nitride film formed by such thermal CVD has a tensile stress of 1 GPa or larger. The direction of this stress is opposite to that of the stress in a buried silicon layer after heat treatment for making it dense to be described later. The thickness of 1 to 5 nm of the silicon oxide film 7 makes it difficult for dilute hydrofluoric acid to be used for etching silicon oxide to penetrate into this thin film 7.

Figure 1D:
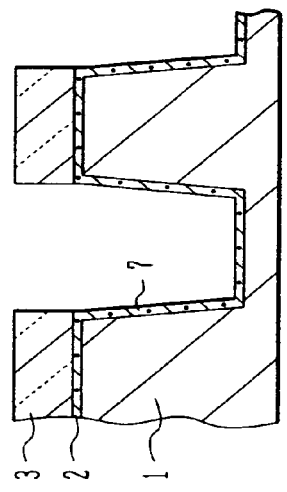

As shown in FIG. 1D, a silicon oxide layer 9 is deposited over the substrate with the silicon nitride film 8, for example, by high density plasma (HDP) CVD, the silicon oxide layer 9 burying the trench. If the trench has a depth of 0.5 μm, the thickness of the silicon layer 9 is set to about 0.6 to 1 μm in the flat area.

The silicon oxide layer is formed by using mixture gas of $SiH_4$ and oxygen or TEOS and ozone as source gas. After the silicon oxide layer 9 is grown, annealing at about 1000° C. is performed to make the silicon oxide layer 9 dense. The film quality of the silicon oxide layer 9 in the trench after the annealing is approximately similar to that of the thermally oxidized film. Although the dense silicon oxide layer has a compression stress, the directions of this compression stress and the tensile stress of the silicon nitride film are opposite so that both the stresses are cancelled out. The mobility can therefore be prevented from being lowered by the compression stress.

Figure 1E:
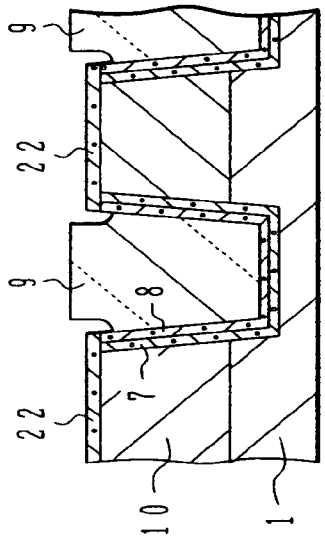

As shown in FIG. 1E, an unnecessary region of the silicon oxide layer 9 at a position higher than the silicon nitride films 3 and 8 is removed by performing chemical mechanical polishing (CMP). CMP is performed by holding the silicon substrate between upper and lower rotating surface plates which are controlled to have, for example, a revolution speed of 20 rpm, a pressure of 5 psi therebetween and a back pressure of 5 psi. As polishing agent, slurry mainly containing colloidal silica or cerium oxide slurry is used.

Under such polishing conditions, an etching rate of the silicon nitride film 3 is small so that the silicon nitride film 3 functions as a polishing stopper. In the state after the polishing, the silicon oxide layer 9 is approximately flush with the silicon nitride film 3, and the silicon oxide layer 9 is left only in the opening defined by the silicon nitride film 3. In this example, although the silicon oxide layer 9 at a position higher than the silicon nitride film 3 is removed by CMP, it may be removed by RIE using mixture gas of $CF_4+CHF_3$.

Figure 1G:
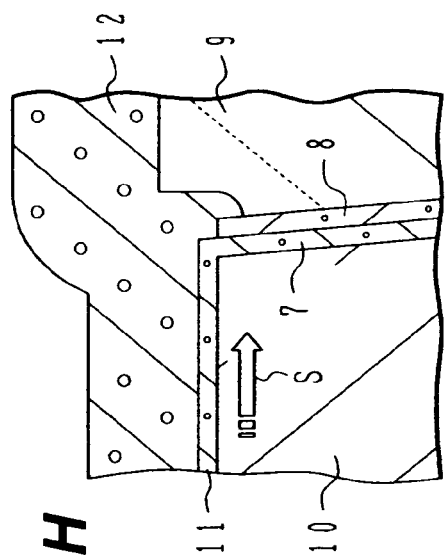
Figure 1F:
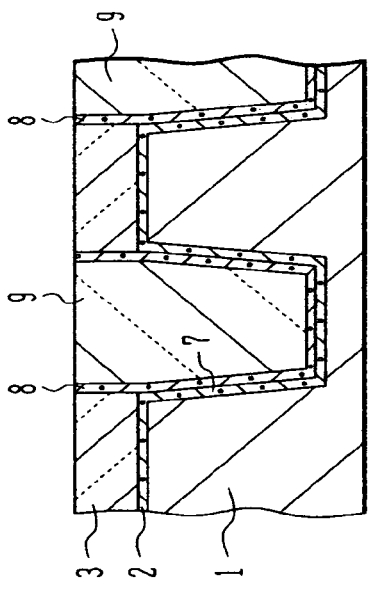

As shown in FIG. 1F, the silicon nitride film 3 is etched by hot phosphoric acid. At this time, the silicon nitride film 8 on the side wall of the silicon nitride film 3 is also etched. As the silicon nitride film 3 is removed, the upper surface of the silicon nitride film 8 between the silicon oxide film 7 on the silicon substrate 1 and the buried silicon oxide layer 9 is exposed.

Since the thickness of the silicon nitride film 8 is set as thin as 2 to 8 nm, hot phosphoric acid having a relatively high viscosity is hard to penetrate into this thin film so that the silicon nitride film 8 between the silicon oxide film 7 and silicon oxide layer 9 is hardly etched.

As the silicon nitride film 3 and the silicon nitride film 8 on the side wall of the silicon nitride film 3 are removed by hot phosphoric acid, the upper portion of the silicon oxide layer 9 protrudes from the surface of the silicon substrate 1 as shown in FIG. 1F.

Thereafter, the silicon oxide film 2 on the surface of the silicon substrate 1 is removed by dilute hydrofluoric acid. At this time, the protruded silicon oxide layer 9 is also etched slightly.

The upper surface of the silicon oxide film 7 formed on the trench surface is also exposed. Since the thickness of the silicon oxide film 7 is set as thin as 1 to 5 nm, dilute hydrofluoric acid is hard to enter this thin film so that the silicon oxide film 7 is hardly etched.

As shown in FIG. 1G, the surface of the silicon substrate 1 is thermally oxidized to grow a sacrificial oxide film 22.

By using the sacrificial oxide film 22 as a through oxide film, ions are implanted into the surface layer of the silicon substrate 1. Implanted impurity ions are activated to form wells 10 having a predetermined conductivity type. For example, n- and p-type wells are formed independently by ion implantation using resist masks. After the well 10 is formed, the sacrificial oxide film is removed by dilute hydrofluoric acid.

A plurality of hydrofluoric acid etching processes etch the projected portion of the silicon oxide layer 9 and divots are formed along the side of the shoulder of the active region. However, the silicon nitride film 8 and silicon oxide film 7 are hardly etched and they cover the side of the active region.

If buffered hydrofluoric acid mixed with $NH_4H$ having a viscosity higher than dilute hydrofluoric acid is used, it is possible to suppress etching the silicon oxide film 7 more reliably.

Figure 1H:
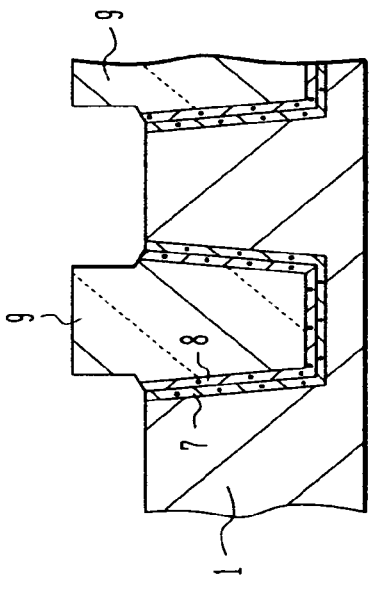

As shown in FIG. 1H, the sacrificial oxide film is removed and the exposed surface of the silicon substrate 1 is thermally oxidized to form a gate insulating oxide film 11 having a thickness of, e.g., 2 nm. Prior to forming the gate insulating oxide film 11, dilute hydrofluoric acid etching is performed to such an extent that a thermally oxidized film would be etched by 20 nm. A polysilicon layer 12 is formed over the substrate surface and patterned to form a gate electrode. Thereafter, impurity ions of a conductivity type opposite to that of the well 10 are implanted to form source/drain regions on both sides of the gate electrode. If necessary, side wall spacers are formed on the side walls of the gate electrode, and impurity ions are implanted and activated to form high impurity concentration source/drain regions.

Figure 2A:
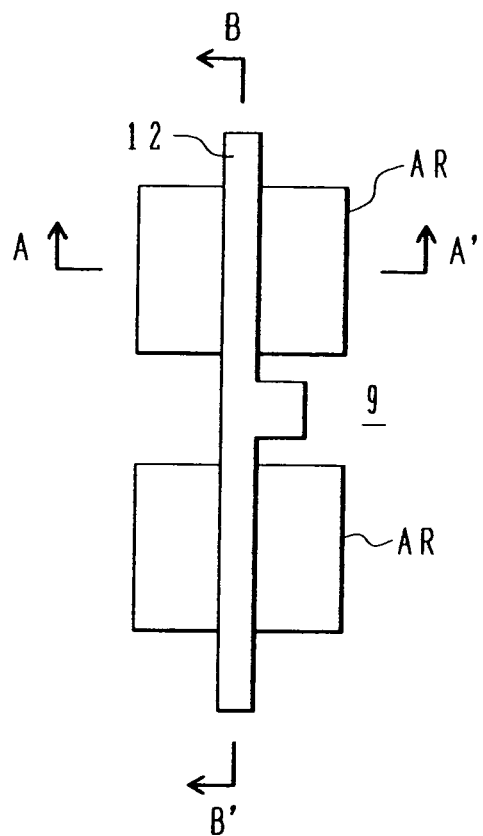
FIGS. 2A and 2B are a plan view and a cross sectional view showing a semiconductor device manufactured by the embodiment method illustrated in FIGS. 1A to 1H.

FIG. 2A is a plan view showing the layout of active regions AR defined by an isolation region 9 and a gate electrode 12 formed on the surface of a silicon substrate. FIGS. 1A to 1H are the cross sectional views taken along line B-B' in FIG. 2A. Each active region AR is surrounded by the isolation region 9. A MOS inverter is constituted of two active regions.

The plan view of FIG. 2A shows the state before side wall spacers are formed. After the side wall spacers are formed, impurity ions having a conductivity type opposite to that of the wells are implanted to form high impurity concentration source/drain regions.

Figure 2B:
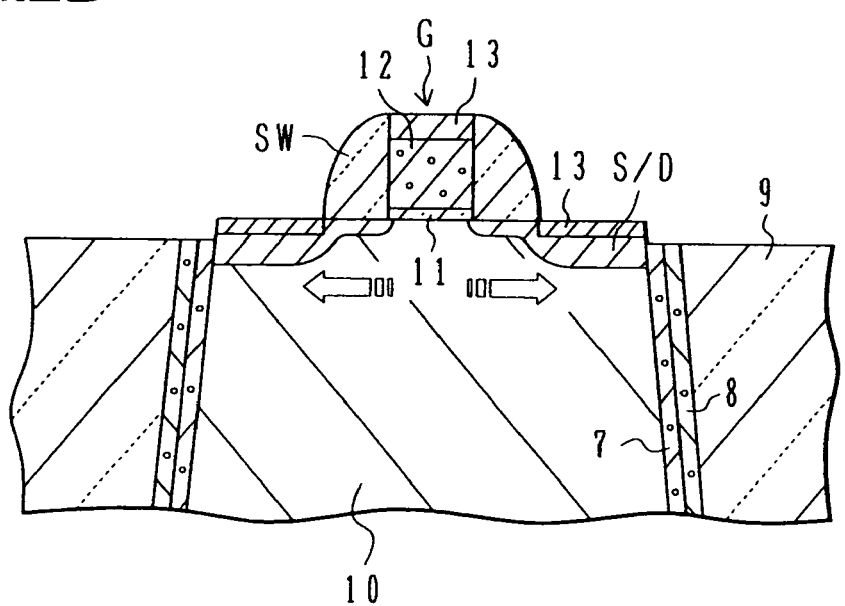

FIG. 2B is a cross sectional view taken along a line A-A' shown in FIG. 2A. As shown in FIG. 2B, the side wall spacers SW are formed on the side walls of the gate electrode, and the source/drain regions S/D are formed on both sides of the gate electrode. A silicide film 13 is formed on the upper surfaces of the gate electrode 12 and source/drain regions S/D. A silicon oxide film 7 and a silicon nitride film 8 are made very thin so that etchant cannot enter these-films and upper surfaces thereof are left scarcely etched.

Since the upper surface of the silicon nitride film 8 is positioned not lower than the surface of the silicon substrate, the tensile stress of the silicon nitride film 8 is applied effectively to the channel region.

Figure 3A:
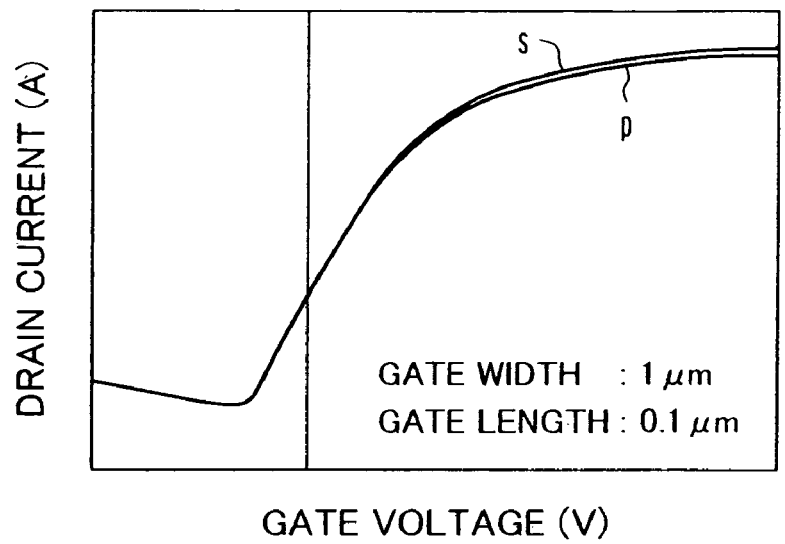
FIGS. 3A and 3B are graphs showing the characteristics of a semiconductor device manufactured by the embodiment method illustrated in FIGS. 1A to 1H, as compared to the characteristics of a semiconductor device of prior art.

FIG. 3A shows the characteristics of a n-type MOS transistor formed by the processes described previously. The characteristics of the MOS transistor having a gate length of 0.1 µm and a gate width of 1 µm were measured. A curve p shows the characteristics of a transistor of conventional techniques, and a curve s shows the characteristics of a transistor of an embodiment. It was confirmed that a saturated drain current increased and the mobility to be otherwise lowered by a compression stress was maintained by the tensile stress of the nitride film. The saturated drain current was improved by 5%. The existence of a parasitic MOS transistor was not confirmed and the absence of a hump was confirmed. The reverse narrow channel effect was also studied.

Figure 3B:
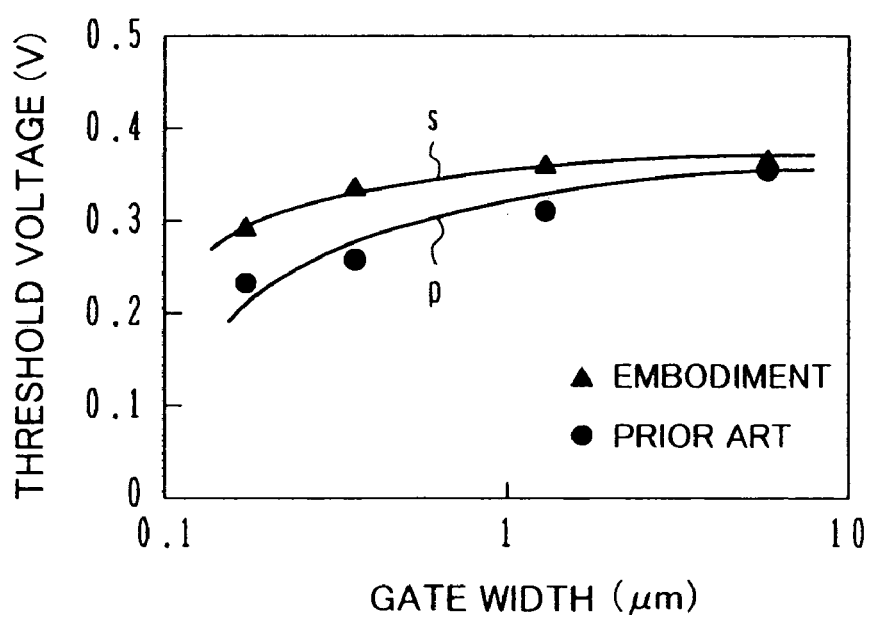

FIG. 3B is a graph showing the measurement results. A curve p shows the characteristics of a transistor of conventional techniques, and a curve s shows the characteristics of a transistor of an embodiment. According to the conventional techniques, as the gate width is made narrow, the threshold voltage gradually lowers, which indicates the existence of the reverse short channel effect. In contrast, it can be seen from the curve s of the embodiment that even if the gate width is made narrow, the threshold voltage scarcely lowers and that the reverse narrow channel effect can be suppressed. This may be ascribed to that there is less contribution of a parasitic MOS transistor.

A tensile stress in a channel region relative to an indent or depression amount of an upper surface of a liner silicon nitride film formed on the inner surface of a trench was simulated by changing the indent position of the upper surface of the silicon nitride film from the surface of the semiconductor substrate.

Figure 4A:
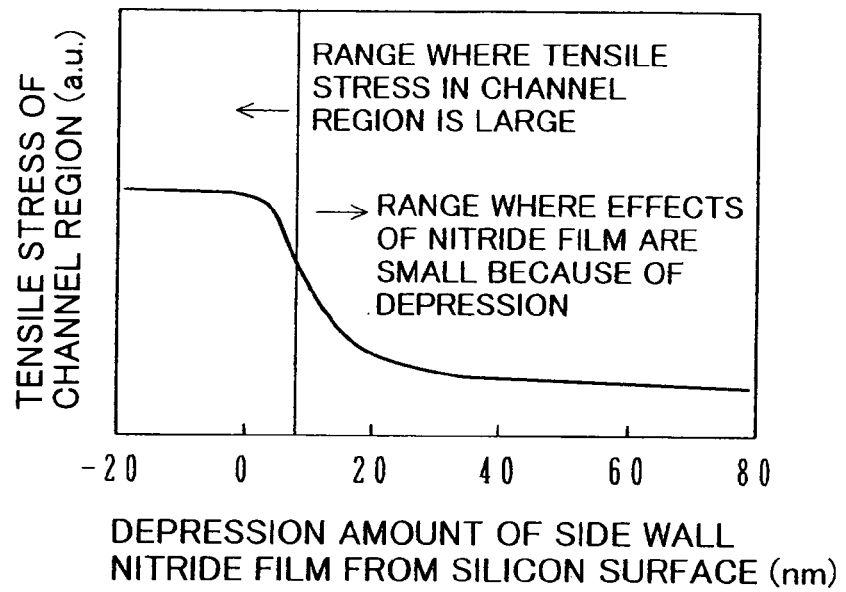
FIGS. 4A and 4B are a graph showing the effects of a silicon nitride film left on the side walls of a trench and a graph showing the dependency of a saturated drain current upon a source/drain width.

FIG. 4A is a graph showing how the tensile stress in the channel region of an active region changes with the depression amount of a side wall silicon nitride film from a silicon substrate surface. The depression amount is 0 when the surface of the silicon nitride film is flush with the surface of the semiconductor substrate, and it increases as the silicon nitride film is depressed from the semiconductor substrate surface. The tensile stress in the channel region reduces as the depression amount of the silicon nitride film increases. If the silicon nitride film is depressed by about 30 nm or more, it can be considered that the effects of the silicon nitride film disappear nearly.

In other words, the tensile stress can be effectively applied to the channel region in the active region by limiting the depression amount of the silicon nitride film from the surface of the semiconductor substrate. The tensile stress can be applied effectively to the channel region by setting the depression amount to about 10 nm or smaller.

A change in the saturated drain current relative to the width (SD width) of a source/drain region along the source/drain direction was also measured.

Figure 4B:
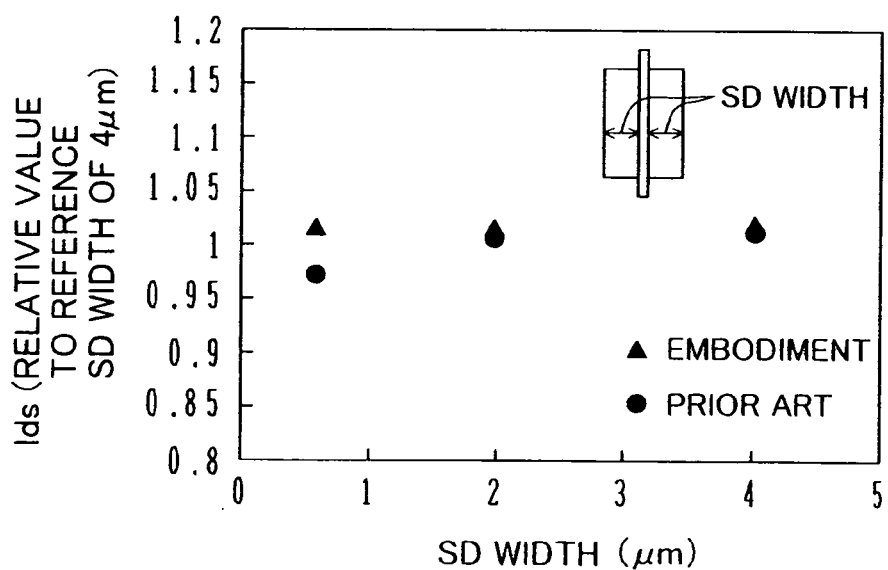

FIG. 4B is a graph showing a change in the saturated drain current relative to the SD width. According to conventional techniques, as the SD width becomes narrow, the saturated drain current Ids lowers. According to the embodiment, even if the SD width becomes narrow, the saturated drain current Ids is maintained almost constant.

In this embodiment, the liner silicon nitride film is formed from the bottom surface to side wall of the trench. The liner silicon nitride film 5 may be formed extending to the upper surface of the active region.

FIGS. 5A to 5D are cross sectional views illustrating main processes of a method of manufacturing a semiconductor device according to another embodiment of the invention.

After processes similar to those described with reference to FIG. 1A are performed, a silicon nitride film 3, a silicon oxide film 2 and a semiconductor substrate 1 are etched by using a resist pattern as an etching mask to form a trench 6 in the semiconductor substrate.

Figure 5A:
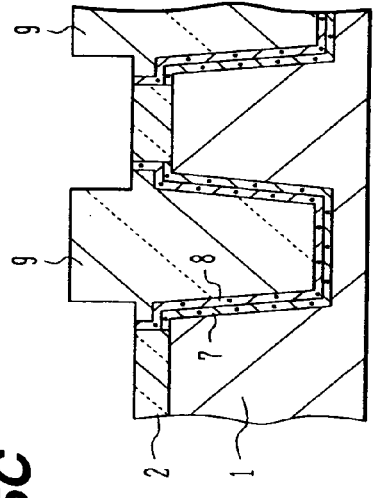
FIGS. 5A to 5D are cross sectional views illustrating a method of manufacturing a semiconductor device according to another embodiment of the invention.

As shown in FIG. 5A, the silicon oxide film 2 is side-etched by dilute hydrofluoric acid solution to retract the silicon oxide film 2 by about 10 nm from the side walls of the silicon nitride film 3. The resist pattern is removed either before or after this side etching.

Figure 5C:
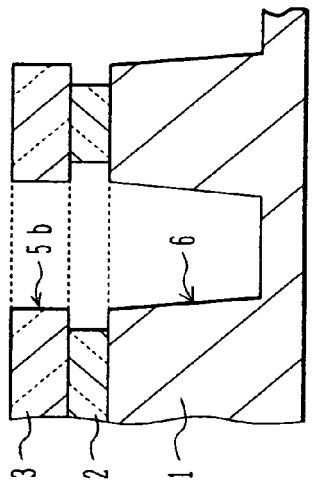
Figure 5B:
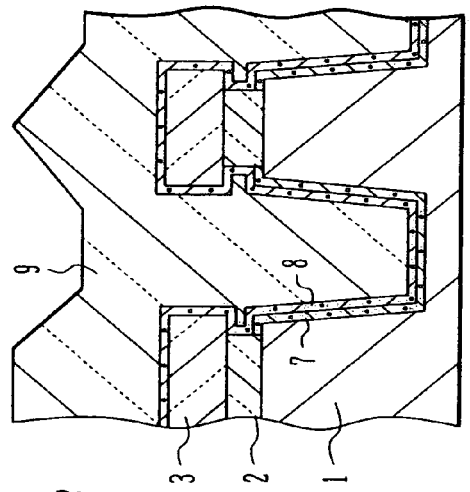

As shown in FIG. 5B, similar to the above-described embodiment, the substrate surface exposed in the trench and in the retracted space of the silicon oxide film 2 is thermally oxidized to form a silicon oxide film 7 having a thickness of 1 to 5 nm. Thereafter, similar to the process in FIG. 1C, a silicon nitride film 8 having a thickness of 2 to 8 nm is formed over the whole surface of the substrate by CVD.

The thickness of the silicon oxide film 2 is set to such a value that the retracted space of the silicon oxide film 2 is not completely filled with the silicon nitride film 8. For example, assuming that the thickness of the silicon oxide film 2 is 15 nm, a twofold of a total thickness of the silicon oxide film 7 and silicon nitride film 8 is set thinner than 15 nm.

As shown in FIG. 5B, a silicon oxide layer 9 is deposited, for example, by HDP-CVD, the trench being buried with the silicon oxide layer 9. Thereafter, similar to the process in FIG. 1F, an unnecessary portion of the silicon oxide layer 9 at the position higher than the silicon nitride films 3 and 8 is removed by CMP. Annealing is performed in order to make the silicon oxide layer 9 dense.

As shown in FIG. 5C, the silicon nitride film 3 and the silicon nitride film 8 in contact with the former film 8 are etched by hot phosphoric acid. In this case, a portion of the silicon nitride film 8 between the silicon oxide film 2 and silicon oxide layer 9 is hardly etched because the thickness of the silicon nitride film 8 is as thin as 2 to 8 nm. As a result, a lamination of the silicon oxide film 7 and silicon nitride film 8 is left on the shoulder of the active region of the silicon substrate 1. Thereafter, similar to the previously described embodiment, the silicon oxide film 2 is removed and a sacrificial oxide film is grown to thereafter perform ion implantation and activation.

Figure 5D:
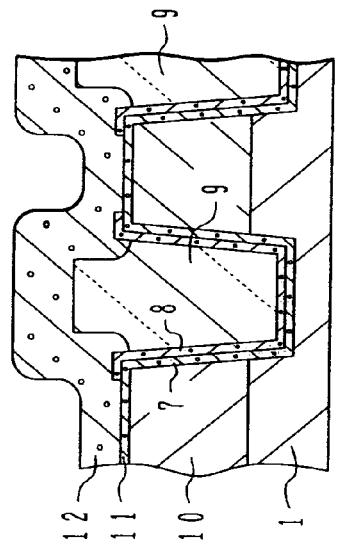

As shown in FIG. 5D, after the sacrificial film is removed and a gate oxide film 11 is formed, a polysilicon layer 12 is deposited and patterned to form a gate electrode.

In this embodiment, the lamination layer of the silicon oxide film 7 and silicon nitride film 8 is left on the shoulder of the active region. Therefore, the tensile stress applied to the channel region becomes large as shown in FIG. 4A. The polysilicon gate electrode 12 formed on the lamination layer faces the shoulder of the active region via the insulating lamination layer thicker than the gate insulating film. Therefore, the electric field concentration can be relaxed.

A method of leaving the lamination layer of the silicon oxide film and silicon nitride film on the shoulder of the active region is not limited to the above embodiment.

FIGS. 6A to 6D are cross sectional views illustrating main processes of a method of manufacturing a semiconductor device according to a further embodiment of the invention.

Figure 6A:
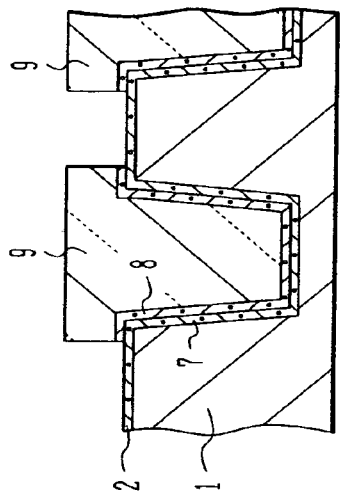
FIGS. 6A to 6D are cross sectional views illustrating a method of manufacturing a semiconductor device according to a further embodiment of the invention.

As shown in FIG. 6A, after a trench is etched, the trench surface in the semiconductor substrate 1 is thermally oxidized to form a silicon oxide film 7 having a thickness of 1 to 5 nm. Next, the silicon nitride film 3 is etched, for example, by about 10 nm by hot phosphoric acid. Since the silicon oxide films 2 and 7 are not etched, only the silicon nitride film 3 is etched so that the silicon nitride film 3 is retracted, for example, by about 10 nm from the side walls of the silicon oxide layer 7. After the side walls of the silicon nitride film 3 are retracted, a silicon nitride film 8 having a thickness of 2 to 8 nm is formed.

Figure 6C:
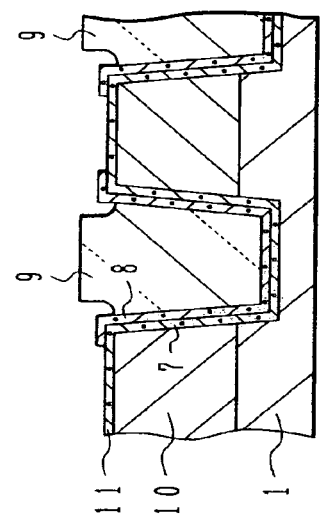
Figure 6B:
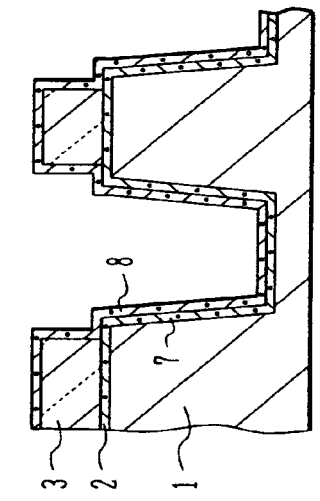

As shown in FIG. 6B, a silicon oxide layer 9 is deposited on the surface of the semiconductor substrate, for example, by HDP-CVD, the trench being buried with the silicon oxide layer 9. The shoulder of the active region of the substrate 1 is covered with portions of the silicon oxide films 2 and 7 and silicon nitride film 8 on which the silicon oxide layer 9 is deposited.

CMP is then performed to remove an unnecessary portion of the silicon oxide layer 9 at the position higher than the surface of the silicon nitride film 3.

As shown in FIG. 6C, the silicon nitride film 3 and the silicon nitride film 8 in contact with the former film 3 are etched by hot phosphoric acid. In this case, a portion of the silicon nitride film 8 between the silicon oxide films 2 and 7 and silicon oxide layer 9 is hardly etched because the hot phosphoric acid does not penetrate into the portion of the silicon nitride film.

Thereafter, similar to the previously described embodiment, the silicon oxide film 2 is removed and a sacrificial oxide film is grown to thereafter perform ion implantation and activation and then remove the sacrificial oxide film.

Figure 6D:
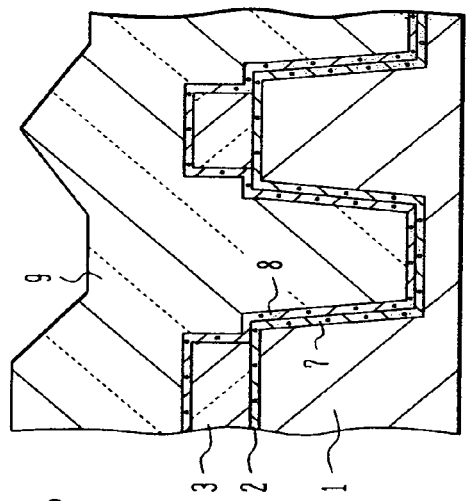

As shown in FIG. 6D, a gate oxide film 11 is formed on the exposed surface of the active region. Although the silicon oxide layer 9 has divots etched along the side of the shoulder of the active region, the shoulder is maintained covered with the silicon oxide films 2 and 7 and silicon nitride film 8. A polysilicon layer is deposited and patterned to form a gate electrode. Similar to the embodiment shown in FIGS. 5A to 5D, since the shoulder of the active region is covered with the lamination layer of the silicon oxide films and silicon nitride film, a large tensile stress is applied to the channel region so that an electric field concentration is relaxed when a voltage is applied to the gate electrode.

In the embodiments described above, the surface of a trench is covered with a liner insulating film made of a lamination layer of a silicon oxide film and a silicon nitride film. The liner insulating film may be made of a single film.

FIGS. 7A to 7H are cross sectional views illustrating main processes of a method of manufacturing a semiconductor device according to still another embodiment of the invention.

Figure 7A:
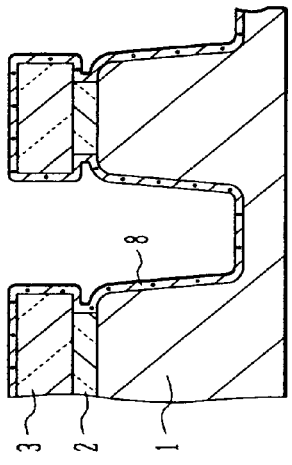
FIGS. 7A to 7H are cross sectional views illustrating a method of manufacturing a semiconductor device according to still another embodiment of the invention.

As shown in FIG. 7A, after a trench is etched, a silicon oxide film 2 is side-etched to retract the side walls of the silicon oxide film 2 by about 10 nm from the side walls of a silicon nitride film 3. This process is similar to the process in FIG. 5A. The condition of limiting the thickness of the silicon oxide film 2 is, however, different.

Figure 7C:
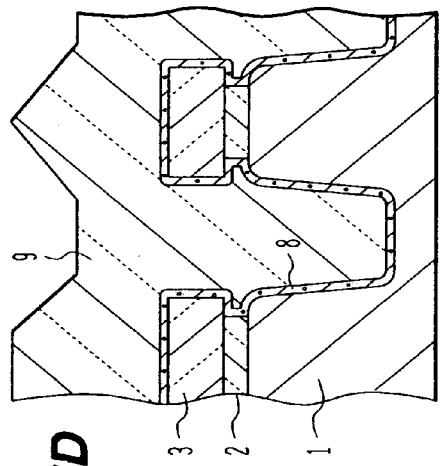
Figure 7B:
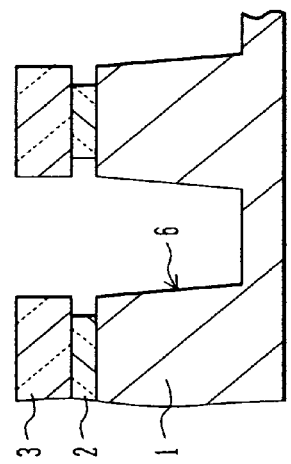

As shown in FIG. 7B, the shoulder of the active region and the bottom corners of the trench are rounded, for example, by chemical dry etching. This dry etching removes the surface layer of the trench, and the layer damaged by trench etching, if any, is removed. The shoulder of the active region is rounded to a circular cross sectional shape having a radius of curvature approximately equal to the retraction amount of the silicon oxide film 2. The silicon surface after dry etching is a clean surface with fewer defects.

As shown in FIG. 7C, a silicon nitride film 8 having a thickness of 2 to 8 nm is formed on the surface of the semiconductor substrate by CVD. If the thickness of the silicon oxide film 2 is set greater than a twofold of the thickness of the silicon nitride film 8, it is possible to prevent the retracted space from being buried with the silicon nitride film 8. For example, assuming that the thickness of the silicon oxide film 2 is 15 nm, the thickness of the silicon nitride film 8 is set to 5 nm.

Figure 7D:
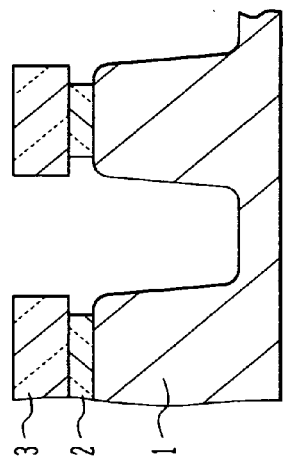

As shown in FIG. 7D, after the silicon nitride film 8 is formed, a silicon oxide layer 9 is deposited to bury the trench.

Figure 7E:
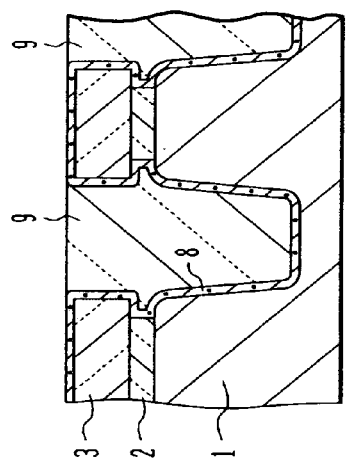

As shown in FIG. 7E, the silicon oxide layer 9 is polished by CMP using the silicon nitride film 9 as a polishing stopper. After the surface of the silicon oxide film 9 is planarized, annealing is performed, for example, for 30 minutes at 1000° C. in an $N_2$ atmosphere in order to make the buried silicon oxide film dense.

Figure 7F:
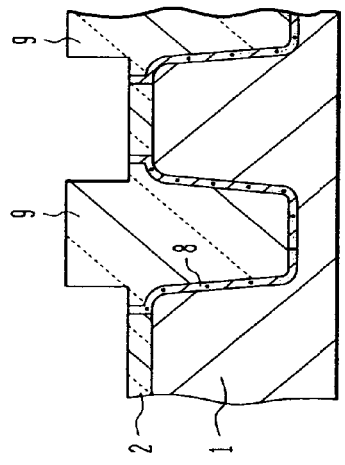

As shown in FIG. 7F, the silicon nitride film 3 is etched by hot phosphoric acid. Portions of the silicon nitride film 8 between the silicon substrate 1 and silicon oxide layer 9 and between the silicon oxide film 2 and silicon oxide layer 9 are left unetched because the hot phosphoric acid cannot penetrate into the portions of the silicon nitride film 8.

Figure 7G:
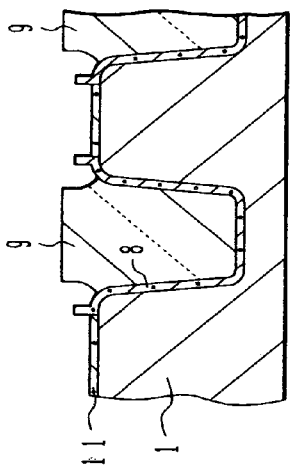

As shown in FIG. 7G, the silicon oxide film 2 is removed, a sacrificial film is grown, and ion implantation and activation is performed. After the sacrificial film is removed, a gate oxide film 11 is formed by thermal oxidation. Although the upper portion of the silicon oxide layer 9 is etched by the dilute hydrofluoric acid process of removing the silicon oxide film, the silicon nitride film 8 covering the shoulder of the active region is left unetched.

Figure 7H:
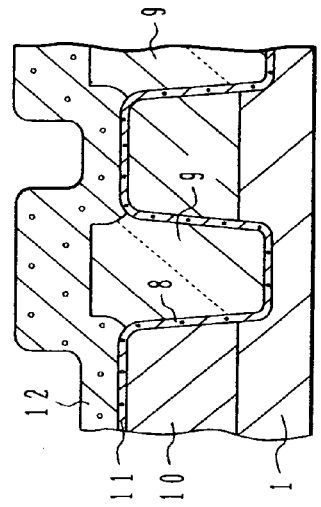

As shown in FIG. 7H, a polysilicon layer 12 is deposited covering the gate oxide film 11, and patterned to form a gate electrode. Since the shoulder of the active region is rounded, the degree of an electric field concentration can be mitigated when a voltage is applied to the gate electrode.

In the embodiments described above, a silicon oxide film and a silicon nitride film are formed on the surface of a silicon substrate, and the silicon nitride film is used as the CMP stopper. A lamination layer having a different structure may be formed on a semiconductor substrate.

FIGS. 8A to 8K are cross sectional views illustrating main processes of a method of manufacturing a semiconductor device according to still another embodiment of the invention.

Figure 8A:
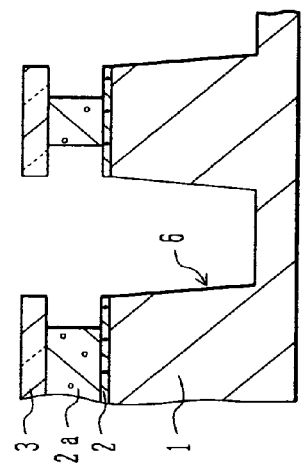
FIGS. 8A to 8K are cross sectional views illustrating a method of manufacturing a semiconductor device according to still another embodiment of the invention.

As shown in FIG. 8A, a silicon oxide film 2 similar to those of the above-described embodiments is formed on the surface of a semiconductor substrate 1. On this silicon oxide film 2, an amorphous silicon film 2a is formed. On this amorphous silicon film 2a, a silicon nitride film 3 similar to those of the above-described embodiments is formed. A photoresist layer is coated on the surface of the silicon nitride film 3, and exposed and developed to form a resist pattern 4.

Figure 8B:
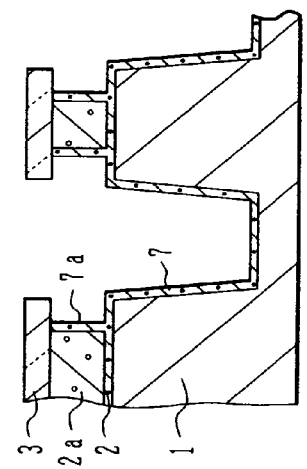

As shown in FIG. 8B, by using the resist pattern 4 as an etching mask, the silicon nitride film 3, amorphous silicon film 2a and silicon oxide film 2 are etched and then the silicon substrate is etched to form a trench 6.

Figure 8C:
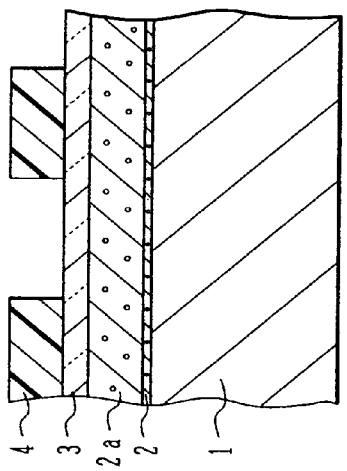

As shown in FIG. 8C, the amorphous silicon film 2a is selectively etched. For example, isotropic etching in a liquid phase is performed by using $HF+HNO_3+H_2O$ or $HF+NH_4OH+H_2O_2+H_2O$ to retract the side walls of the amorphous silicon film 2a. During this etching, the silicon substrate 1 is scarcely etched because of a difference of an etching selection ratio between the amorphous silicon film and crystal silicon.

Figure 8D:
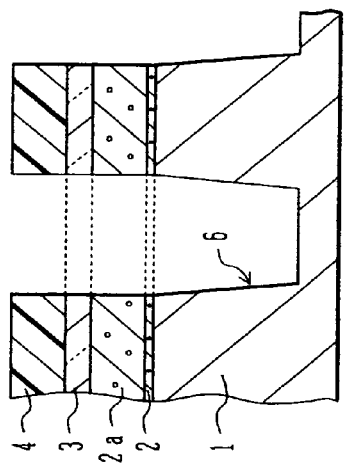

As shown in FIG. 8D, the exposed silicon surface is oxidized. A silicon oxide film 7a is formed on the amorphous silicon film 7 and a silicon oxide film 7 is formed on the silicon substrate. Instead of oxidizing the silicon surface, it may by oxynitridized. The thickness of the silicon oxide film or silicon oxynitride film is set to such a value that etchant for etching silicon oxide in a later process is hard to penetrate into the film. The silicon oxynitride film has a smaller etching rate than the silicon oxide film so that the detraction amount by etching can be reduced.

Figure 8E:
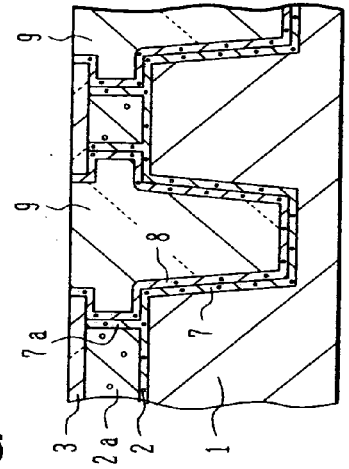

As shown in FIG. 8E, a silicon nitride film 8 is formed on the whole surface of the substrate to a thickness of, e.g., 5 nm by CVD. The thickness of the silicon nitride film 8 is set to such as value that hot phosphoric acid etchant does not penetrate into the silicon nitride film 8.

Figure 8F:
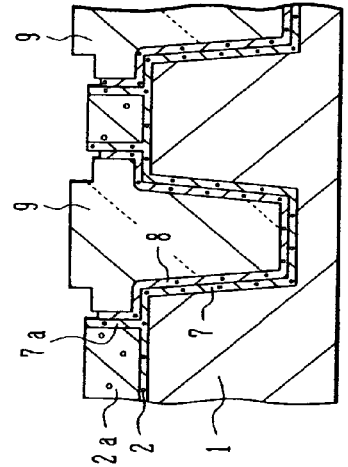

As shown in FIG. 8F, a silicon oxide layer 9 is deposited burying the trench. As shown, the shoulder of the active region is covered with a lamination layer of the silicon oxide film 7 and silicon nitride film 8, and the siliconoxide layer 9 covers the lamination layer.

Figure 8G:
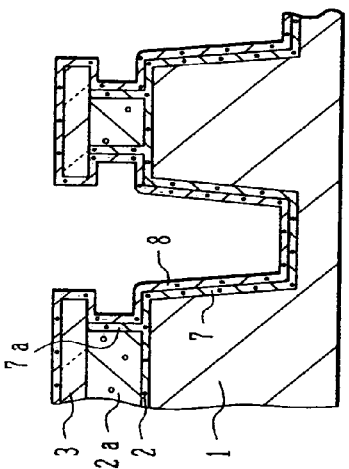

As shown in FIG. 8G, CMP is performed to remove an unnecessary portion of the silicon oxide layer 9 at the position higher than the silicon nitride film 3. The state shown in FIG. 8G shows the silicon nitride film 3 partially removed. CMP is performed to the extent that the silicon nitride film 3 appears and is not removed completely.

Figure 8H:
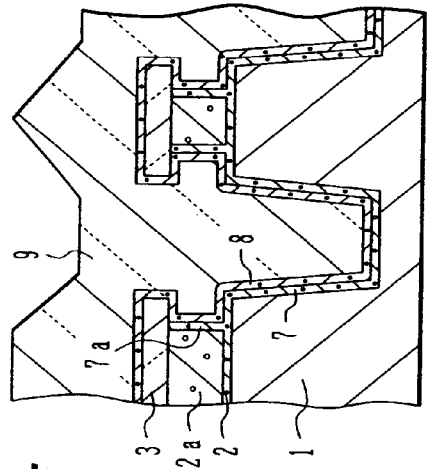

As shown in FIG. 8H, the silicon nitride film is removed by hot phosphoric acid. With this etching, the exposed silicon nitride film 3 and the silicon nitride film 8 in contact with the former film are etched. However, since the thickness of the silicon nitride film 8 is selected to such an extent that the hot phosphoric acid does not penetrate into the silicon nitride film 8, the retraction amount of the silicon nitride film 8 from the upper surface thereof is limited.

Figure 8K:
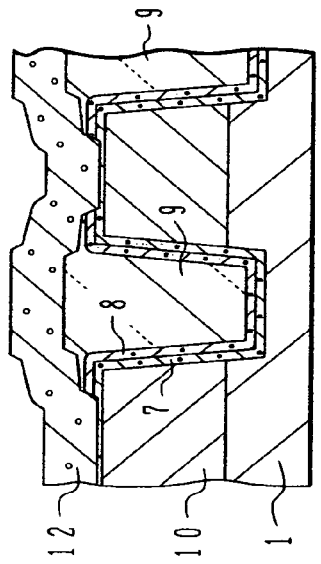
Figure 8I:
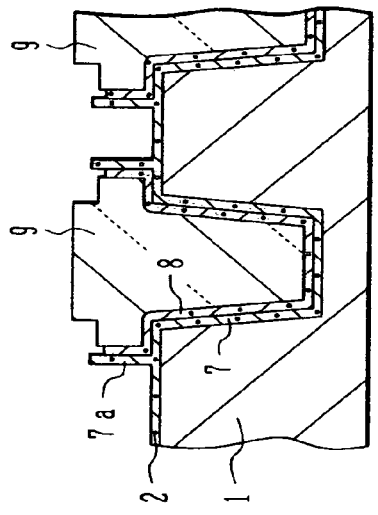

As shown in FIG. 8I, the amorphous silicon film 2a is removed by $NH_3+H_2O$+isopropyl alcohol (IPA).

Figure 8J:
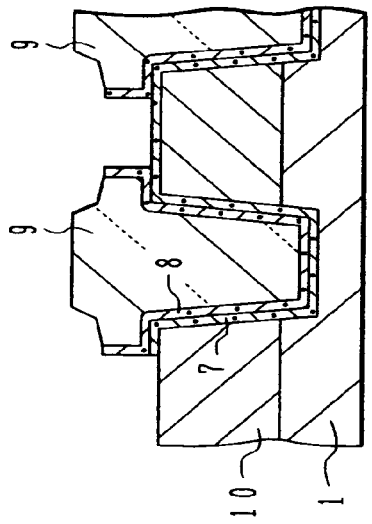
Figure 9A:
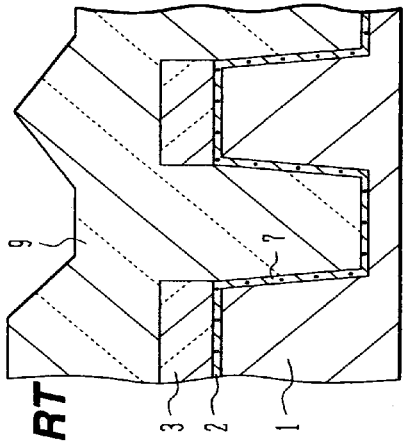
FIGS. 9A to 9H are cross sectional views illustrating a method of manufacturing a semiconductor device according to prior art and a graph showing the characteristics of a transistor manufactured by this method.
Figure 9C:
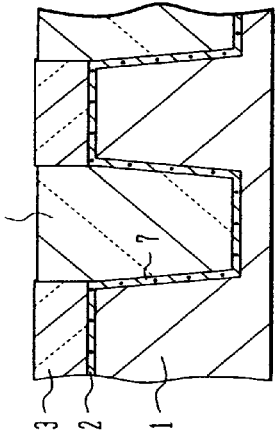
Figure 9B:
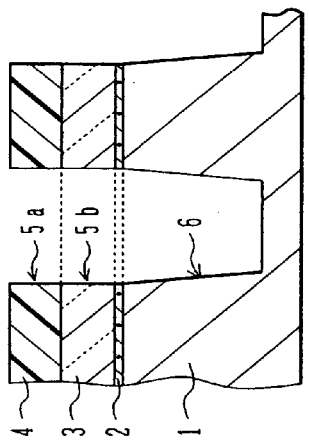
Figure 9D:
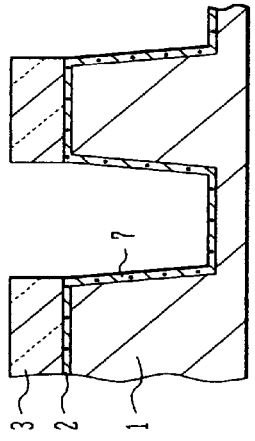
Figure 9E:
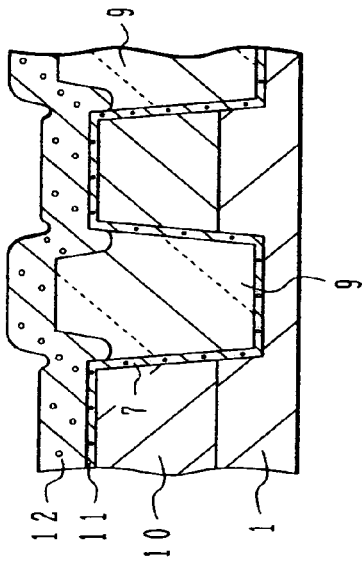
Figure 9G:
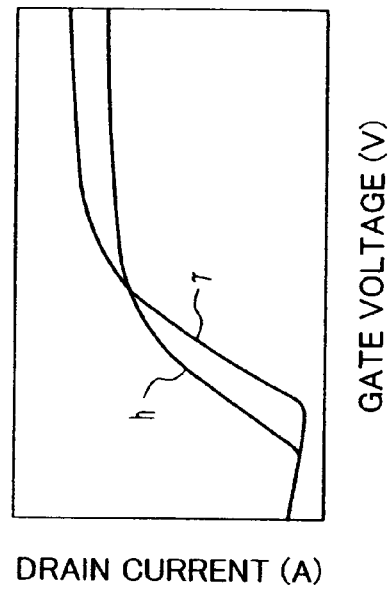
Figure 9F:
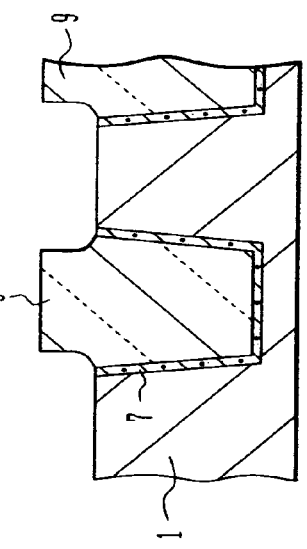
Figure 9H:
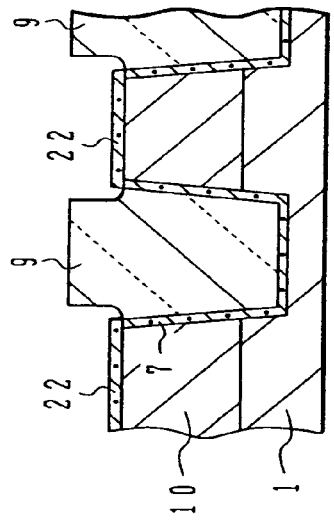

As shown in FIG. 8J, the silicon oxide films 2 and 7a are removed. This etching slightly etches the surface of the silicon oxide layer 9. The nitride film 8, when projected, may be, removed since it is very thin. Thereafter, a sacrificial film is formed and ion implantation and activation is performed to form wells 10. After the sacrificial film is removed, a gate oxide film is formed on the exposed surface of the active region.

As shown in FIG. 8K, a polysilicon film is formed covering the gate insulating film 11, and patterned to form a gate electrode 12. The shoulder of the active region is maintained covered with the silicon oxide film 7 and silicon nitride film 8. Depending upon the process conditions, a portion of the silicon oxide layer 9 is left on the silicon nitride film 8. Since the gate electrode 12 is formed on this structure, an electric field concentration upon the shoulder of the active region can be relaxed when a voltage is applied to the gate electrode. A large tensile stress is applied to the channel region.

The present invention has been described in connection with the preferred embodiments. The invention is not limited only to the above embodiments. It is apparent that various modifications, improvements, combinations, and the like can be made by those skilled in the art.

What is claimed:

1. A semiconductor device comprising:
   a silicon substrate;
   an isolation trench formed in said silicon substrate for isolating n-type and p-type active regions in said silicon substrate, said isolation trench having a trapezoidal cross sectional shape having a width gradually narrowing with a depth from a surface of said silicon substrate, and said active regions having flat upper surfaces;
   a liner insulating film formed on a surface of said isolation trench surrounding said n-type and p-type active regions and a silicon nitride film having a thickness of 2 to 8 nm;
   an isolation region burying said trench defined by said liner insulating film;
   an n-channel MOS transistor formed in said p-type active region with a first gate electrode formed over said p-type active region; and
   a p-channel MOS transistor formed in said n-type active region with a second gate electrode formed over said n-type active region;
   wherein said silicon nitride film extends from side walls of said trench to partially overlay said flat upper surfaces of the active regions; and
   wherein each of said gate electrodes is formed over the flat upper surface of the active region, said liner insulating film on the flat upper surface of the active region, and said isolation region so as to traverse the active region.

2. A semiconductor device according to claim 1, wherein said isolation region includes a portion extending on said liner insulating layer above the upper surface of said silicon substrate.

3. A semiconductor device according to claim 2, wherein said liner insulating film includes a portion extending on side walls of said extending portion of said isolation region.

4. A semiconductor device according to claim 1, wherein said first gate electrode extends on the isolation region to be continuous to said second gate electrode.

5. A semiconductor device comprising:
   a silicon substrate;
   an isolation trench formed in said silicon substrate for isolating active regions in said silicon substrate, said isolation trench having generally a trapezoidal cross sectional shape having a width gradually narrowing with a depth from a surface of said silicon substrate and having a gradually broadening upper portion, said isolation trench defining the active regions, said active regions having rounded shoulders, and flat upper surfaces, and forming n-type and p-type wells;
   a liner insulating film formed in direct contact with a surface of said trench and made of a silicon nitride film having a thickness of 2 to 8 nm;
   an isolation region burying said trench defined by said liner insulating film;
   a gate electrode formed over said active region, said liner insulating film on the flat upper surface of the active region, and said isolation region, so as to traverse the active region.

6. A semiconductor device according to claim 5, wherein an upper end of said liner insulating film is retracted by less than about 10 nm from the surface of said silicon substrate.

7. A semiconductor device according to claim 5, wherein said liner insulating film has a tensile stress of 1 GPa or larger.

8. A semiconductor device according to claim 5, wherein said gate electrode traverses the n-type and p-type wells.

* * * * *